United States Patent [19]

Kudo

[11] 4,309,626
[45] Jan. 5, 1982

[54] DIFFUSED RESISTOR

[75] Inventor: Osamu Kudo, Tokyo, Japan

[73] Assignee: Fujitsu Limited, Japan

[21] Appl. No.: 139,169

[22] Filed: Apr. 11, 1980

[30] Foreign Application Priority Data

Apr. 16, 1979 [JP] Japan ................................. 54-46442

[51] Int. Cl.³ ............................................ H01L 27/04
[52] U.S. Cl. ..................................... 307/303; 357/22;
357/48; 357/51; 357/86
[58] Field of Search ....................... 357/51, 22, 48, 86;
307/303

[56] References Cited

U.S. PATENT DOCUMENTS 3,700,977 10/1972 Lunn ..................................... 357/51
4,034,395 7/1977 Abdelrahman ....................... 357/51
4,161,742 7/1979 Kane ..................................... 357/51
4,164,668 8/1979 Delaporte et al. ..................... 357/51
4,263,518 4/1981 Ballatone et al. .................... 307/303

FOREIGN PATENT DOCUMENTS 6474 1/1980 European Pat. Off. .............. 357/51
2415878 of 0000 France .
51-140581 12/1976 Japan .

OTHER PUBLICATIONS

Bergeron et al., IBM Technical Disclosure Bulletin, vol. 20, No. 3, Aug. 1977, p. 1089.

Primary Examiner—William D. Larkins
Attorney, Agent, or Firm—Staas & Halsey

[57] ABSTRACT

A diffused resistor for an integrated circuit comprising two resistor portions. Each of the resistor portions comprises a semiconductor substrate of a first conductivity type, an isolated epitaxial region of a second conductivity type, a diffused region (i.e. a resistance layer) of the first conductivity type, a contacting region of the second conductivity type and terminals. An end portion of the resistance layer in one of the resistor portions is connected to one of the ends of the resistance layer in the other resistor portion so that these resistance layers combine to form a resistor. In the other resistor portion the other end portion of the resistance layer is connected to the contacting region. Depletion layers generated in the resistor portions vary so as to maintain the resistance of the diffused resistor constant.

16 Claims, 6 Drawing Figures

DIFFUSED RESISTOR

BACKGROUND OF THE INVENTION

1. Field of the Invention

The present invention relates to resistors for semiconductor devices, and more particularly to diffused resistors for integrated circuits.

2. Description of the Prior Art

In general, a resistor is used as a passive element in a integrated circuit (IC). A diffused resistor is one well known type of such resistor. The structure of a typical diffused resistor is shown in FIGS. 1a and 1b. FIG. 1a is a schematic cross-sectional view of the resistor and FIG. 1b is a schematic plan view taken on line I—I, in FIG. 1a. On a p-type semiconductor substrate 1 (FIG. 1a), an $n^+$-type buried layer 2 and an $n^-$-type epitaxial layer 3 are formed. A portion of the epitaxial layer 3 is isolated from the rest of the epitaxial layer 3 by surrounding it with a $p^+$-type isolating region 5, as shown in FIG. 1b, to form an $n^-$-type isolated region 4. In the isolated region 4, a $p^+$-type diffused region (i.e. a resistance layer) 6 and an $n^+$-type diffused region (i.e. a contact layer) 7 are formed. An insulating layer 8 covers the epitaxial layer 3 except for the contacting surfaces for terminals 9, 10 and 11, as shown in FIGS. 1a and 1b. A desired resistance of the resistance layer 6, i.e. of the diffused resistor layer, can be obtained by determining the length (L) and the width (W) (FIG. 1b) of the resistance layer 6 between the terminals 9 and 10. When the electric current flows in the resistance layer 6, the p-n junction between the resistance layer (i.e. the $p^+$-type diffused region) 6 and the $n^-$-type isolated region 4 is always reverse biased by connecting the terminal 11 to a potential that is more positive than potentials of the terminals 9 and 10 of the resistance layer 6. A diffused resistor such as the above-mentioned is described in, for example, Paul R. Gray, Robert G. Meyer: Analysis and Design of Analog Integrated Circuits, (1977), pp. 99-103 [John Wiley & Sons, Inc.].

When the p-n junction is reverse biased, a depletion layer is generated in the both sides of the p-n junction interface. In the case of the above-mentioned diffused resistor, since there is a potential difference between the terminals 9 and 10 of the resistance layer 6, the thickness of the depletion layer below the terminal 9 is different from that of the depletion layer below the terminal 10. If the potential of the terminal 9 is lower than that of the terminal 10, the thickness of the former depletion layer is greater than that of the latter depletion layer. The thickness of the depletion layer decreases along the length (L) of the resistance layer 6 in the direction from the terminal 9 to the terminal 10. Accordingly, a resistance value (r) per unit length of the resistance layer 6 varies, as indicated by a solid line A of FIG. 2. In FIG. 2 symbols "a" and "b" indicate the spot of the terminal 9 and the spot of the terminal 10, respectively. In this case, the resistance ($R_A$) of the diffused resistor is obtained by calculating the shaded area of FIG. 2.

If the potential of the terminal 9 is decreased, namely, when a voltage applied across the terminals 9 and 10 is increased, the thickness of the depletion layer below the terminal 9 become thicker. Accordingly, the resistance value (r) per unit length at the terminal 9 becomes larger compared to the above-mentioned case. The resistance value (r) per unit length varies, as indicated by a broken line B of FIG. 2. In this case, the resistance ($R_B$) of the diffused resistor becomes larger than the resistance ($R_A$) of the above-mentioned case. If the potential of the terminal 9 is increased in the same level of the potential of the terminal 10, the resistance value (r) per unit length of the resistance layer 6 becomes constant, as indicated by a broken line C of the FIG. 2. In this case, the resistance ($R_C$) of the diffused resistor becomes smaller than the resistance ($R_A$) of the above-mentioned case.

As is clear from the above-described explanation, the resistance (R) of the diffused resistor varies according to the voltage applied across the terminals 9 and 10 of the resistance layer 6. It is easily possible to maintain a positive voltage applied to the isolated region 4 of the epitaxial layer 3 at a constant value. For example, it is preferable to connect the terminal 11 to a positive terminal of a power source, so that the isolated region 4 has the most positive potential in the integrated circuit. However, the voltage applied across the terminals 9 and 10 is changed during the operation of the integrated circuit. The relationship between the current flowing in the resistance layer 6 and the voltage applied to the resistance layer 6 is indicated by a solid curve D in FIG. 3, for the case where the voltage is increased by reducing the potentional of the terminal 9. Such a relationship is caused by increasing the resistance of the resistor along with an increase in the voltage.

SUMMARY OF THE INVENTION

It is an object of the present invention to provide a diffused resistor which is used in an integrated circuit and having a resistance which hardly varies in spite of the variation in the voltage applied to the diffused resistor.

The above and other objects of the present invention are achieved by providing a diffused resistor which comprises a semiconductor substrate of a first conductivity type; an epitaxial layer of a second conductivity type, opposite to the first conductivity type, which is formed on the substrate and has first and second isolated regions; a first diffused region of the first conductivity type which is formed in the first isolated region and has first and second terminals on the end portions thereof; a second diffused region of the first conductivity type which is formed in the second isolated region and has third and fourth terminals on the end portions thereof, the third terminal being connected to the second terminal; a third diffused region of the second conductivity type which is formed in the first isolated region and has a fifth terminal and; a fourth diffused region of the second conductivity type which is formed in the second isolated region and has a sixth terminal connected to the fourth terminal.

It is preferable that the diffused resistor further comprises first and second buried layers of the second conductivity type which are formed between the substrate and the epitaxial layer.

The present invention will become more apparent from the detailed description of the invention set forth below, with reference to the accompanying drawings.

BRIEF DESCRIPTION OF THE DRAWINGS

FIG. 1b is a schematic plan view taken on line I—I in FIG. 1a;

DETAILED DESCRIPTION OF THE PREFERRED EMBODIMENT

Figure 1A:
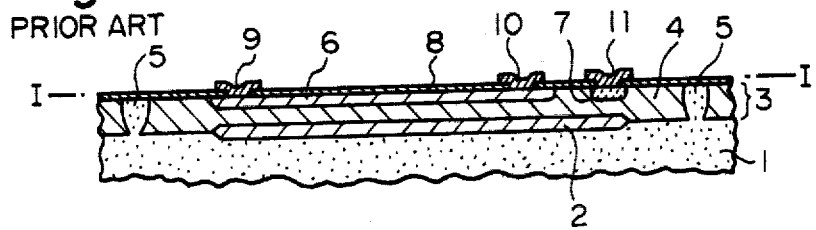
FIG. 1a is a schematic cross-sectional view of a prior art diffused resistor.
Figure 1B:
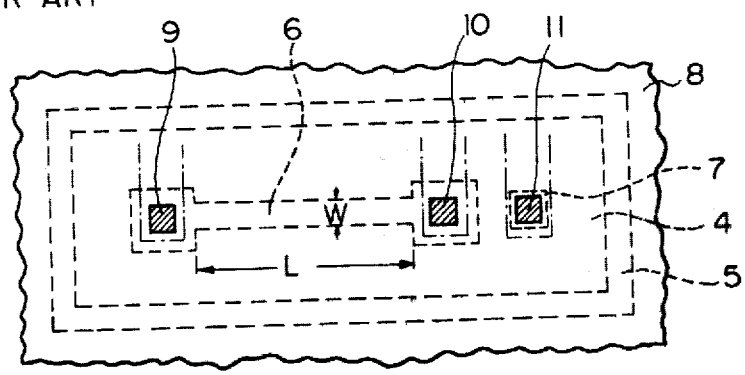
Figure 2:
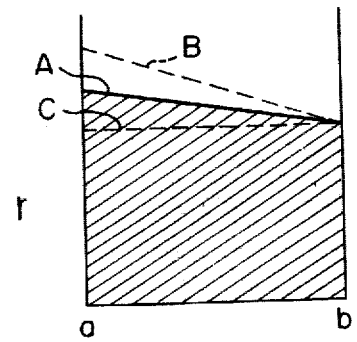
FIG. 2 is a diagram illustrating the relationship between resistance value (r) per unit length and length of resistance layer of the diffused resistor of FIG. 1b.
Figure 3:
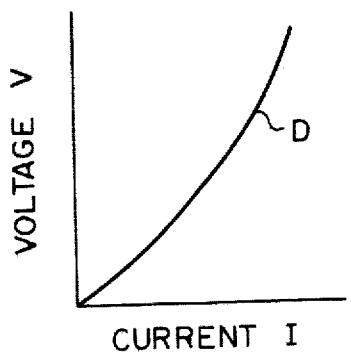
FIG. 3 is a diagram illustrating the a relationship between voltage applied to resistance layer and current flowing in the resistance layer of the diffused resistor of the prior art.
Figure 4:
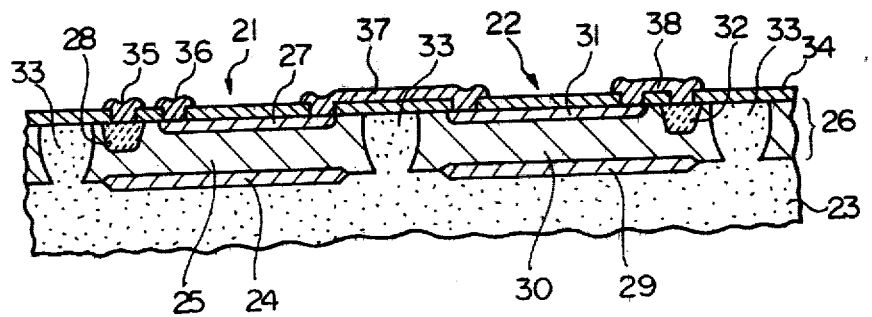
FIG. 4 is a schematic cross-sectional view of an embodiment of the diffused resistor of the present invention; and, FIG. 5 is a diagram illustrating the relationship between the resistance value (r) per unit length and the lengths of two resistor layers of the diffused resistance of FIG. 4.

Referring now to FIG. 4, there is shown a diffused resistor according to the present invention which comprises a first resistor portion 21 and a second resistor portion 22. The first resistor portion 21 comprises a p-type semiconductor substrate 23, an n+-type buried layer 24, an n⁻-type isolated region 25 of a semiconductor epitaxial layer 26, a p+-type diffused region (i.e. a first resistance layer) 27, and an n+-type diffused region (i.e. a contacting layer) 28. The second resistor portion 22 comprises the p-type substrate 23, an n+-type buried layer 29, an n⁻-type isolated region 30 of the epitaxial layer 26, a p+-type diffused region (i.e. a second resistance layer) 31 and an n+-type diffused region (i.e. a contacting layer) 32. Both the isolated regions 25 and 30 are surrounded with p+-type isolating regions 33 which are connected to each other. An insulating layer 34 covers the epitaxial layer 26 including the diffused regions 27, 28, 31 and 32 and the isolating regions 33 except for the contacting surfaces for terminals 35, 36, 37 and 38. The terminal 37 connects the first and second resistance layers 27 and 31, as shown in FIG. 4. The terminal 38 connects the second resistance layer 31 and the contacting layer 32.

The above-mentioned diffused resistor (FIG. 4) is produced as follows. The starting material is a p-type semiconductor substrate 1, such as a silicon substrate. An n⁻-type semiconductor epitaxial layer 26, such as a silicon epitaxial layer, is grown on the substrate 1 by a conventional epitaxial growth technique. The grown epitaxial layer has a thickness in the range of 2000 to 15000 nm. In order to form n+-type buried layers 24 and 29, donor impurities (e.g. P, As or Sb) are selectively diffused into the substrate 1 prior to the growth of the epitaxial layer. Then, a p+-type isolating region 33 is formed with the epitaxial layer 26 by a conventional isolation diffusion technique to isolate regions 25 and 30 from the rest of the epitaxial layer 26.

Acceptor impurities (e.g. B, In or Al) are diffused into the isolated regions 25 and 30 by a conventional selective diffusion technique to form a p+-type diffused region (i.e. a first resistance layer) 27 and another p+-type diffused region (i.e. a second resistance layer) 31, respectively. The sheet resistance of the resistance layers 27 and 31 is in the range of 30 to 5000 ohm/square. Then, donor impurities are selectively diffused into the isolated region 25 and 30 by the conventional selective diffusion technique to simultaneously form n+-type diffused regions (i.e. contacting layers) 23 and 32, respectively.

An insulating layer 34 made of silicon dioxide, silicon nitride or alumina is formed on the epitaxial layer 26 by any suitable process. For example, the silicon epitaxial layer 26 is thermally oxidized to form the silicon dioxide insulating layer 34 having a thickness in the range 200 to 2000 nm. The insulating layer 34 is selectively etched by a well-known photolithographic technique to open windows on the contacting layers 28 and 32 and both end portions of the p+-type diffused regions (i.e. the first and second resistance layers) 27 and 31. A conductor film, e.g. aluminum, is deposited on the entire top surface by a conventional evaporation technique. The deposited conductor film is selectively etched by the well-known photolithographic technique to form a desired pattern of terminals 35, 36, 37 and 38. The terminal 37 connects the end portion of the first resistance layer 27 and that of the second resistance layer 31, and the terminal 38 connects the other end portion of the second resistance layer 31 and the contacting layer 32. The first and second resistance layers 27 and 31 are combined into the diffused resistor. Terminals 36 and 38 serve as terminals of the diffused resistor.

When the produced diffused resistor is used as an element of an integrated circuit, the terminal 35 is connected to a potential that is more positive than potentials of the terminals 36 and 38 and the potential of the terminal 36 is always lower than that of the terminal 38. For example, the terminal 35 is connected to the most positive potential in the integrated circuit. For example, a source voltage ($V_{cc}$) is supplied to the terminal 35. The terminal 36 is connected to ground. A positive input voltage ($V_1$) is applied across the terminals 36 and 38. As a result, the resistance value (r) per unit length of the resistance layers 27 and 31 varies, as indicated by a solid line E in FIG. 5.

Figure 5:
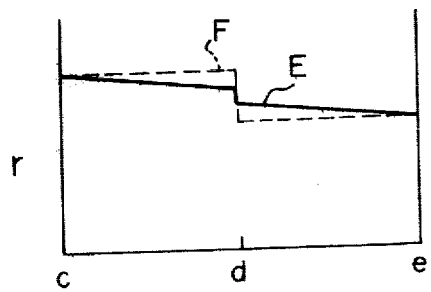

In FIG. 5 symbols "c", "d" and "e" indicate the position of the terminal 36, the spot of the terminal 37 and the position of the terminal 38, respectively. If no voltage is applied across the terminals 36 and 38, for example, if the terminal 38 is also connected to ground, the resistance value (r) per unit length becomes as indicated by a broken line F in FIG. 5. When the positive potential ($V_1$) is applied to the terminal 38 and the terminal 36 is connected to ground, a depletion layer is generated in the first resistor position 21 by a voltage in the range of $V_{cc}$ to ($V_{cc}-V_2$), where $V_2$ is the potential of terminal 37; therefore the resistance value (r) per unit length is decreased in the direction from the terminal 36 to the terminal 37, as shown in FIG. 5. Simultaneously, in the second resistor portion 22, a depletion layer is generated by a voltage in the range of ($V_1-V_2$) to zero; therefore, the resistance value (r) per unit length is increased in the direction from the terminal 38 to the terminal 37, as shown in FIG. 5. Thus, when the positive potential applied to the terminal 38 is increased, on the one hand the resistance of the resistance layer 27 is decreased and on the other hand the resistance of the resistance layer 31 is increased. Therefore, it is possible to compensate for the decreased amount of resistance of the resistance layer 27 and the increased amount of resistance of the resistance layer 31 by combining the first and second resistor portions 21 and 22. As a result, the total resistance of the first and second resistor portions 21 and 22 can be held almost constant in spite of the variation in the applied voltage. In addition, an almost linear relation can be obtained between the voltage and the current of the diffused resistor.

Since the diffused resistor according to the present invention has an almost constant resistance, the performance of an integrated circuit having such a resistor is improved over an integrated circuit including a conventional diffused resistor. Therefore, it is useful to connect the diffused resistor of the present invention between the input and output terminals of an operational amplifier to provide a current-voltage converter with good linearity.

It will be obvious that the present invention is not restricted to the above-described embodiment and that many variations are possible for those skilled in the art without departing from the scope of the present invention. For example, with respect to the conductivity type, the p-type the semiconductor substrate and the resistance layers may be changed to an n-type and the n-type buried layer, the epitaxial layer and the contacting layers may be changed to a p-type simultaneously. This would result in a diffused resistor (FIG. 4) comprising an n-type semiconductor substrate, a $p^+$-type burried layer, a $p^-$-type epitaxial layer and $n^+$-type resistance layers. In this case a potential applied to the first terminal should be higher than those applied to the the fourth and fifth terminals. The resistance layers may be formed by a conventional ion-implantation technique instead of the conventional diffusion technique.

I claim:

1. A resistor, for a semiconductor device, comprising:
   a semiconductor substrate of a first conductivity type;
   first and second isolated regions of a second conductivity type, opposite to said first conductivity type, formed on said semiconductor substrate;
   a first impurity region of the first conductivity type formed in said first isolated region, said first impurity region having first and second end portions and having first and second terminals formed on said first and second end portions, respectively;
   a second impurity region of the first conductivity type formed in said second isolated region, said second impurity region having third and fourth end portions and having third and fourth terminals formed on said third and fourth end portions, respectively, said third terminal electrically connected only to said second terminal;
   a fifth terminal formed on said first isolated region;
   a sixth terminal formed on said second isolated region and electrically connected to said fourth terminal; and
   means for supplying potentials to said first, fourth and fifth terminals so that depletion layers are generated in said first and second isolated regions, said means for supplying potentials including means for maintaining a substantially constant potential across said first and fifth terminals, said substantially constant potential of a polarity to reverse bias the pn junction.

2. A resistor, for a semiconductor device, comprising:
   a semiconductor substrate of a first conductivity type;
   first and second buried layers of a second conductivity type, opposite to said first conductivity type, formed on said semiconductor substrate;
   first and second isolated regions of the second conductivity type formed on said semiconductor substrate and on said first and second buried layers, respectively;
   a first impurity region of the first conductivity type formed in said first isolated region, said first impurity region having first and second end portions and having first and second terminals formed on said first and second end portions, respectively;
   a second impurity region of the first conductivity type formed in said second isolated region, said second diffused region having third and fourth end portions and having third and fourth terminals formed on said third and fourth end portions, respectively, said third terminal electrically connected only to said second terminal;
   a fifth terminal formed on said first isolated region;
   a sixth terminal formed on said second isolated region and electrically connected to said fourth terminal; and
   means for supplying potentials to said first, fourth and fifth terminals so that depletion layers are generated in said first and second isolated regions, said means for supplying potentials including means for maintaining a substantially constant potential across said first and fifth terminals, said substantially constant potential of a polarity to reverse bias the pn junction.

3. A resistor according to claim 1 or 2, wherein said first and second isolated regions are each surrounded by an isolating region of the first conductivity type.

4. A resistor according to claim 1 or 2, wherein each of said first through sixth terminals has a contacting surface, said resistor further comprising an insulating layer formed on said first and second isolated regions and said first and second impurity regions except for the contacting surfaces of said first through sixth terminals.

5. A resistor according to claim 1 or 2, wherein the first conductivity type is p-type and wherein the potential applied to said first terminal is less positive than the potentials applied to said fourth and fifth terminals.

6. A resistor according to claim 1 or 2, wherein the first conductivity type is n-type and wherein the potential applied to said first terminal is higher than the potentials applied to said fourth and fifth terminals.

7. A resistor according to claim 1 or 2, wherein said semiconductor substrate is silicon.

8. A resistor according to claim 1 or 2, wherein said first and second isolated regions are silicon.

9. A resistor according to claim 8, wherein each of said silicon first and second isolated regions has a thickness of from 2,000 to 15,000 nm.

10. A resistor according to claim 2, wherein said first and second buried layers are formed by selectively diffusing donor impurities into the semiconductor substrate.

11. A resistor according to claim 10, wherein the donor impurities are one of phosphorous, arsenic and antimony.

12. A resistor according to claim 1 or 2, wherein said first and second impurity regions are formed by diffusing acceptor impurities into said first and second isolated regions.

13. A resistor according to claim 12, wherein said acceptor impurities are one of boron, indium and aluminum.

14. A resistor according to claim 1 or 2, wherein said first and second impurity regions have a sheet resistance of from 30 to 5,000 ohm/square.

15. A resistor according to claim 4, wherein said insulating layer is one of silicon dioxide, silicon nitride and alumina.

16. A resistor according to claim 15, wherein said insulating layer is a silicon dioxide layer having a thickness of from 200 to 2,000 nm.

* * * * *